(12) United States Patent
Li

(10) Patent No.: US 8,197,035 B2
(45) Date of Patent: Jun. 12, 2012

(54) ACTUATOR DEVICE AND LIQUID EJECTING HEAD INCLUDING THE SAME

(75) Inventor: Xin-Shan Li, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/097,941

(22) Filed: Apr. 29, 2011

(65) Prior Publication Data

US 2011/0205311 A1 Aug. 25, 2011

Related U.S. Application Data

(63) Continuation of application No. 12/013,864, filed on Jan. 14, 2008, now Pat. No. 7,950,783.

(30) Foreign Application Priority Data

Jan. 15, 2007 (JP) .................................. 2007-005593

(51) Int. Cl.
  *B41J 2/045* (2006.01)
  *H01L 41/047* (2006.01)
(52) U.S. Cl. .............................. 347/68; 347/70; 310/365
(58) Field of Classification Search .................... 347/70; 310/323.06; 252/62.9 PZ
See application file for complete search history.

(56) References Cited

U.S. PATENT DOCUMENTS

| | | | |
|---|---|---|---|
| 6,336,717 B1 | 1/2002 | Shimada et al. | |
| 6,411,017 B1 * | 6/2002 | Qiu et al. | 310/358 |
| 6,502,928 B1 | 1/2003 | Shimada et al. | |
| 2005/0030352 A1 * | 2/2005 | Murai et al. | 347/72 |
| 2005/0194867 A1 | 9/2005 | Kawakubo et al. | |
| 2005/0242687 A1 * | 11/2005 | Kawakubo et al. | 310/324 |

FOREIGN PATENT DOCUMENTS

| | | |
|---|---|---|
| EP | 0 980 103 | 2/2000 |
| EP | 1 346 828 | 9/2003 |
| JP | 2002-314163 | 10/2002 |
| JP | 2002-319714 | 10/2002 |
| JP | 2003-174211 | 6/2003 |
| JP | 2005-014265 | 1/2005 |

* cited by examiner

*Primary Examiner* — Matthew Luu
*Assistant Examiner* — Lisa M Solomon
(74) *Attorney, Agent, or Firm* — Workman Nydegger

(57) ABSTRACT

An actuator device includes a piezoelectric element including a lower electrode, a piezoelectric layer, and an upper electrode that are displaceably provided in sequence on a substrate. The lower electrode includes a flat center portion and an inclined end portion that descends toward the substrate. The piezoelectric layer is disposed above the lower electrode and the substrate, and includes a first, second, and third piezoelectric layer portion constituted by a plurality of columnar crystals. The columnar crystals of the first and second piezoelectric layer portions are orthogonal to the flat portion of the lower electrode and surface of the substrate, while the columnar crystals of the third piezoelectric layer portion extend orthogonally from a surface of the inclined portion and bend to be orthogonal to the surface of the upper electrode, giving the grains of the columnar crystals of the third piezoelectric layer portion larger widths and increased stress resistance.

4 Claims, 4 Drawing Sheets

ACTUATOR DEVICE AND LIQUID EJECTING HEAD INCLUDING THE SAME

CROSS-REFERENCE TO RELATED APPLICATIONS

This application is a continuation of U.S. patent application Ser. No. 12/013,864 filed Jan. 14, 2008, which claimed priority to Japanese Patent Application No. 2007-005593, filed Jan. 15, 2007 the entire disclosures of which are expressly incorporated by reference herein.

BACKGROUND OF THE INVENTION

1. Technical Field

The present invention relates to actuator devices for liquid ejecting heads. More specifically, the present invention relates to actuator devices which include vibrating plates and piezoelectric elements that are displaceably provided on a substrate.

2. Related Art

Typically, the piezoelectric elements used in actuator devices have a structure wherein a piezoelectric material, such as a piezoelectric layer made of a crystallized dielectric material, which functions as an electromechanical transducer is disposed between a lower and upper electrode. These actuator devices are typically called flexural-oscillation-mode actuator devices, and are often used in liquid ejecting heads, such as those used in ink jet recording heads, wherein a series of vibrating plates constituting part of pressure-generating chambers communicating with the nozzle openings of the recording head are deformed by the piezoelectric elements. By deforming the vibrating plates, the ink in the pressure-generating chambers is pressurized and ultimately ejected as ink droplets through the nozzle openings of the liquid ejecting head.

In some configurations, a separate piezoelectric element is independently formed for each pressure-generating chamber in a lithographically process wherein a piezoelectric material layer uniformly deposited over the entire surface of the vibrating plates is divided so as to correspond with each pressure-generating chamber. For example, Japanese Patent Applications JP-A-2002-314163, JP-A-2002-319714, and JP-A-2003-174211 disclose examples of independently formed piezoelectric elements which include a lower electrode disposed on a substrate, a piezoelectric layer disposed on the lower electrode, and an upper electrode disposed on the piezoelectric layer, such that one end of the lower electrode and is perpendicular to the top surface of the substrate.

One problem with these configurations, however, is that operating the piezoelectric element of the actuator result in cracks in the piezoelectric layer as the stress from the actuation causes a concentration of stress at the boundary between the upper and lower electrode comprising the active piezoelectric region and the remaining inactive portions of the piezoelectric region.

BRIEF SUMMARY OF THE INVENTION

An advantage of some aspects of the invention is that it provides an actuator device including a piezoelectric layer with increased stress resistance when voltage is applied to a pair of electrodes.

One aspect of the invention is an actuator device comprising a piezoelectric element including a lower electrode, a piezoelectric layer, and an upper electrode that are displaceably and sequentially formed on a substrate. The lower electrode includes a flat center portion and an inclined end portion that descends toward the substrate. The piezoelectric layer includes a first piezoelectric layer portion comprising a plurality of columnar crystals which extend orthogonally to a surface of the flat center portion of the lower electrode, a second piezoelectric layer portion comprising a plurality of columnar crystals which extend orthogonally to a surface of the substrate, and a third piezoelectric layer portion comprising a plurality of columnar crystals disposed on the inclined portion of the lower electrode between the first and second piezoelectric layer portions. The columnar crystals of the third piezoelectric layer portion extend orthogonally from a surface of the inclined portion of the lower electrode and bend toward the upper electrode so as to extend orthogonally to the surface of the substrate. The grains of the columnar crystals in the third piezoelectric layer have larger widths than the grains of the columnar crystals of the first and second piezoelectric layer portions at the surface of the piezoelectric layer where the upper electrode is formed.

A second aspect of the invention is a liquid ejecting head including a channel-forming substrate provided with a pressure-generating chamber which is capable of communicating with a nozzle opening in order to eject liquid from the nozzle opening, wherein the actuator device of the first aspect of the invention acts as a liquid ejecting unit that is provided on a surface of the channel-forming substrate and is capable of changing the pressure in the pressure-generating chamber.

In each aspect of the invention, the actuator device has an intermediate piezoelectric region constituted by columnar crystals having a high strength. This provides increased stress resistance, providing a more reliable and durable actuator and liquid ejecting head.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described in detail with reference to the drawings.

First Embodiment

Figure 1:
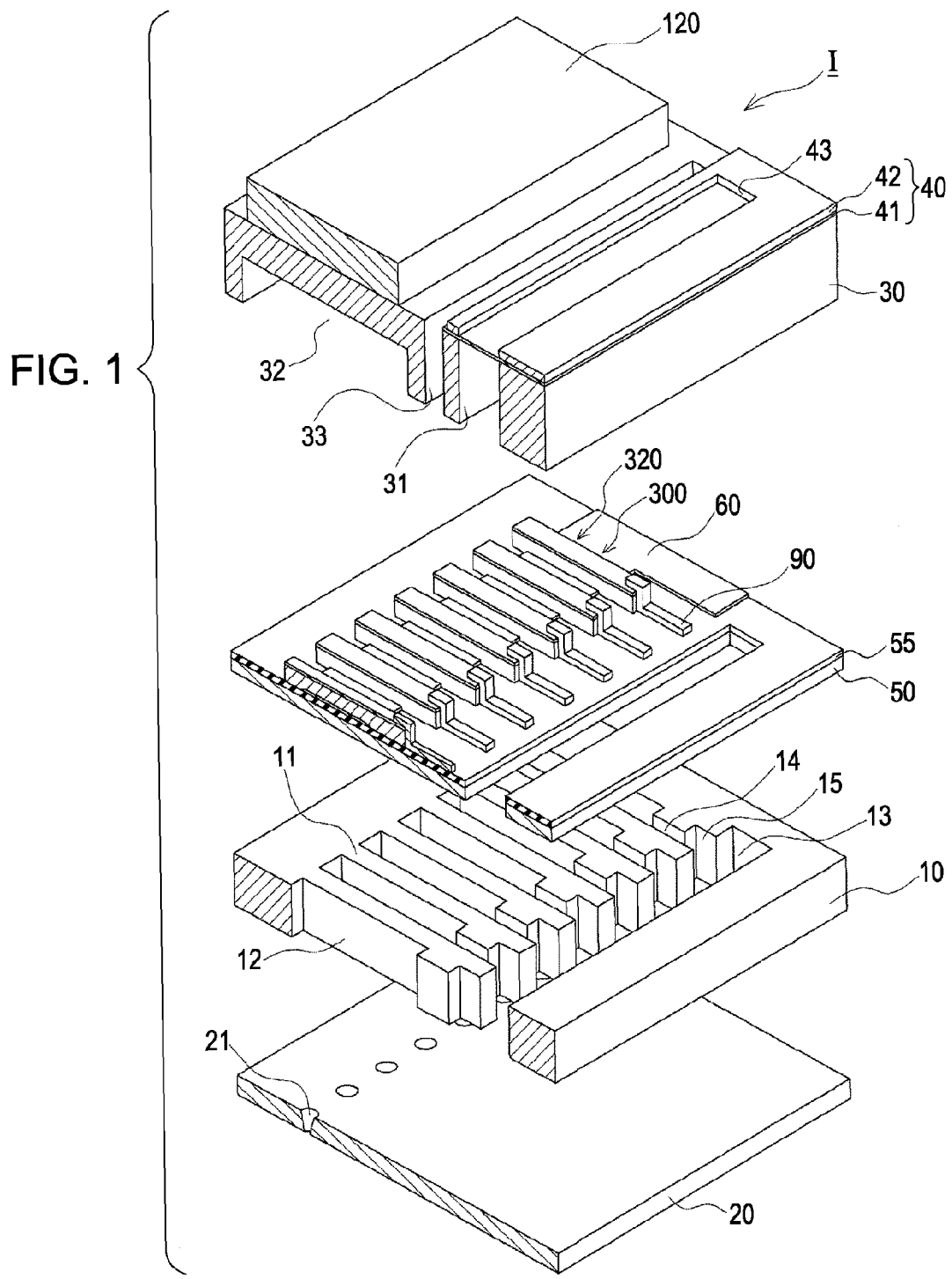
FIG. 1 is a exploded perspective view of a recording head according to a first embodiment of the invention.
Figure 2A:
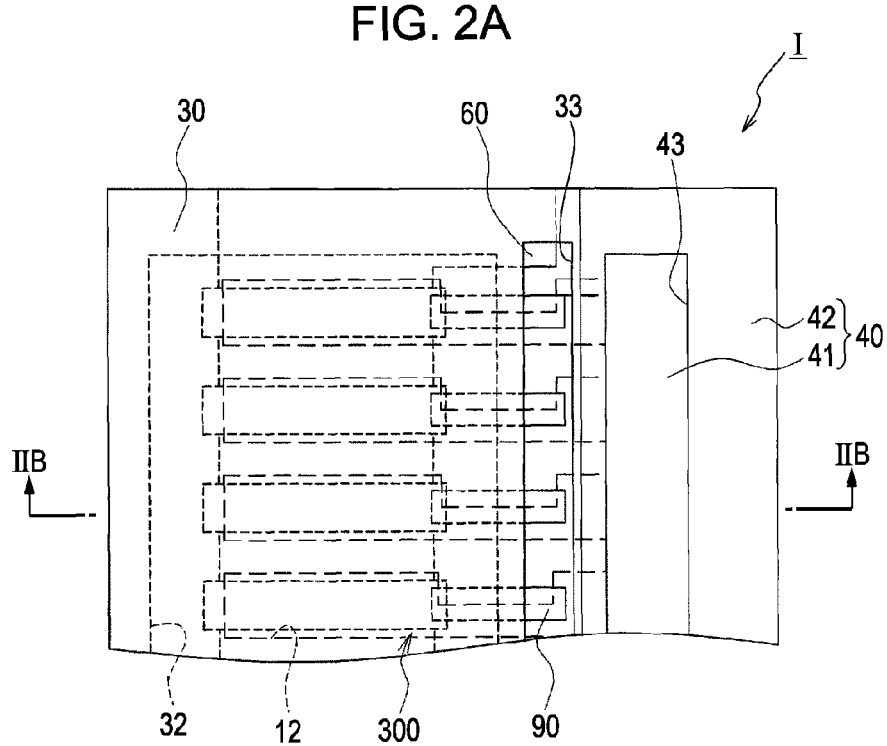
FIG. 2A is a plan view of the recording head according to the first embodiment of the invention.
Figure 2B:
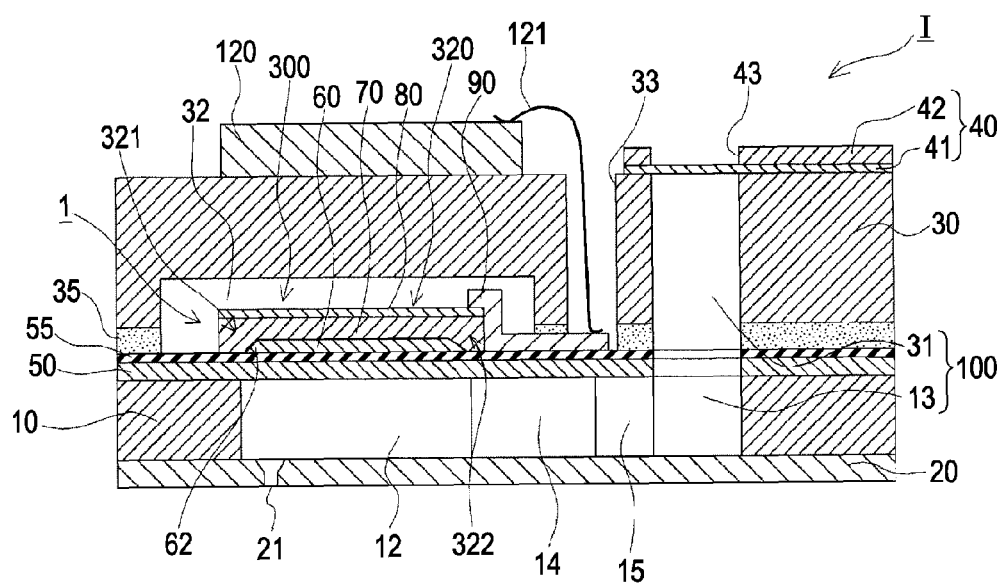
FIG. 2B is a sectional view of the recording head according to the first embodiment of the invention.

FIG. 1 is a exploded perspective view of an ink jet recording head I, which is an example of a liquid ejecting head according to a first embodiment of the invention. FIGS. 2A and 2B are a plan view and a sectional view of the same recording head I, respectively, wherein the sectional view of FIG. 2B is taken along line IIB-IIB in FIG. 1.

As shown in FIGS. 1-2B, the first embodiment of the ink jet recording head I includes a channel-forming substrate 10 made of a silicon single crystal having a (110) crystal plane orientation. An elastic film 50 composed of silicon dioxide and having a thickness of 0.5 μm to 2 μm is preliminarily formed on the top surface of the channel-forming substrate 10 by a thermal oxidation process.

The channel-forming substrate 10 has pressure-generating chambers 12 arranged parallel to each other in the width direction, referred to as the "lateral direction," of the channel-forming substrate 10. The pressure-generating chambers 12 are defined by a plurality of partitions 11 that are formed by performing an anisotropic etching process on the bottom surface of the channel-forming substrate 10. Each of the partitions 11 further defines an ink supply channel 14 and a communicating channel 15 at one end of the ink supply channel 14 in the longitudinal direction. The communicating channels 15 correspond to each pressure-generating chamber 12 of the channel-forming substrate 10. Each of the communicating channels 15 communicate at one end with a communicating region 13 that constitutes a portion of a reservoir 100 that serves as a common ink chamber (liquid chamber) for the pressure-generating chambers 12. In short, the channel-forming substrate 10 has a communicating region that is connected to a plurality of liquid channels each of which includes a pressure-generating chamber 12, an ink supply channel 14, and a communicating channel 15.

Each ink supply channel 14 communicates with an end of a corresponding pressure-generating chamber 12 and have a cross-section that is smaller than the cross-section of the pressure-generating chamber 12.

A nozzle plate 20 has a plurality of nozzle openings 21 bored therein, each of which communicates with a corresponding pressure-generating chamber 12 at the end of the pressure-generating chamber 12 that is opposite to the end of the pressure-generating chamber 12 that communicates with the ink supply channel 14. The nozzle plate 20 is bonded to an open surface of the channel-forming substrate 10 with an adhesive, a heat welding film, or the like. The nozzle plate 20 may be made of, for example, a glass-ceramic plate, a silicon single-crystal substrate, a stainless steel plate, or the like.

As described above, in this configuration, an elastic film 50 composed of silicon dioxide and having a thickness of about 1.0 μm is provided on the top surface of the channel-forming substrate 10. The insulator film 55 may be deposited on the elastic film 50 and be composed of zirconium oxide ($ZrO_2$) or the like, and have a thickness of about 0.4 μm.

The insulator film 55 supports a plurality of layers, including a lower electrode film 60 having a thickness of about 0.1 μm to 0.5 μm, a piezoelectric layer 70 of dielectric film that is described more fully below in detail which is composed of lead zirconate titanate (PZT) or the like with a thickness of about 1.1 μm, and an upper electrode film 80 composed of gold, platinum, iridium, or the like and with a thickness of about 0.05 μm so as to cover the lower electrode film 60 and piezoelectric layer 70. These layers together form the piezoelectric elements 300. In the first embodiment, the lower electrode film 60 extends across each of the pressure-generating chambers 12, thereby serving as a common electrode for the piezoelectric elements 300. The lower electrode film 60 has inclined portions 62 at its ends. The inclined portions 62 extend downward from the top surface of the lower electrode film 60 toward the channel-forming substrate 10. The piezoelectric layers 70 and the upper electrode films 80 extend beyond the inclined portions 62 so as to cover portions of the lower electrode film 60 in correspondence with the piezoelectric elements 300, whereby the upper electrode films 80 serve as individual electrodes for the piezoelectric elements 300. In the first embodiment, the elastic film 50, the insulator film 55, and the lower electrode film 60 constitute a vibrating plate. Further, the vibrating plate and each piezoelectric element 300 constitute an actuator device 1. Herein, the piezoelectric element 300 refers to a structure including the lower electrode film 60, the piezoelectric layer 70, and the upper electrode film 80. In the first embodiment, the lower electrode film 60 serves as a common electrode for all the piezoelectric elements 300, and the upper electrode films 80 serve as individual electrode for each of the piezoelectric elements 300. However, their roles may also be reversed, depending on the specific arrangement of the driving circuit or wiring. In either case, an active piezoelectric region 320 is provided for each of the pressure-generating chambers 12.

The piezoelectric layer 70 of the first embodiment is, for example, a crystal film provided on the lower electrode film 60 and having a perovskite structure made of a ferroelectric ceramic material which is capable of functioning as an electromechanical transducer. The piezoelectric layer 70 is preferably composed of a ferroelectric-piezoelectric material such as lead zirconate titanate (PZT), or a mixture of the ferroelectric-piezoelectric material and a metaloxide such as niobium oxide, nickel oxide, or magnesium oxide. Specifically, lead titanate ($PbTiO_3$), lead zirconate titanate ($Pb(Zr,Ti)O_3$), lead zirconate ($PbZrO_3$), lead lanthanum titanate (($Pb,La),TiO_3$), lead lanthanum zirconate titanate (($Pb,La)(Zr,Ti)O_3$), lead zirconate titanate magnesium niobate ($Pb(Zr,Ti)(Mg,Nb)O_3$), or the like can be used. Preferably, the piezoelectric layer 70 of the first embodiment is composed of lead zirconate titanate (PZT).

Preferably, the upper electrode film 80 which acts as the individual electrode of the piezoelectric element 300 is provided with a lead electrode 90 composed of gold (Au). The lead electrode 90 is connected at an end of the upper electrode film 80 near the ink supply channel 14 and extends down onto the insulator film 55.

The channel-forming substrate 10 is bonded to a protective substrate 30 with an adhesive 35. The protective substrate 30 has a reservoir section 31 constituting at least a part of the reservoir 100. The reservoir section 31 of the first embodiment extends into the protective substrate 30 so as to communicate with the communicating region 13. As described above, the reservoir section 31 and the communicating region 13 in the channel-forming substrate 10 communicate with each other and constitute the reservoir 100 that serves as the common liquid chamber of the pressure-generating chambers 12. It is also possible that the communicating region 13 in the channel-forming substrate 10 is divided into compartments which correspond to each pressure-generating chamber 12 so that only the reservoir section 31 acts as the reservoir. In another configuration, only the pressure-generating chambers 12 are provided in the channel-forming substrate 10, meaning that the ink supply channels 14 which communicate with the reservoir and the pressure-generating chambers 12 are provided in a member interposed between the channel-forming substrate 10 and the protective substrate 30, such as the elastic film 50 or the insulator film 55.

The protective substrate 30 has a piezoelectric-element retaining section 32 provided in a region over the piezoelectric elements 300, which has an internal space large enough so as not to interfere with the operation of the piezoelectric elements 300. The piezoelectric-element retaining section 32 may be either sealed or unsealed, so long as it provides an internal space large enough not to interfere with the operation of the piezoelectric elements 300.

The protective substrate 30 is preferably made of a glass or ceramic material having a coefficient of thermal expansion that is substantially equivalent to that of the channel-forming substrate 10. In the first embodiment, the protective substrate 30 is made of the same material as the channel-forming substrate 10, i.e., a silicon single-crystal substrate.

The protective substrate 30 also includes a penetrating-opening 33 that extends from the surface of the protective substrate 30, so that tips of the lead electrodes 90 extending from the piezoelectric elements 300 may be exposed through the penetrating-opening 33.

Further, a driving circuit 120 is mounted on the protective substrate 30 which is capable of driving the piezoelectric elements 300. The driving circuit 120 may be, for example, a circuit substrate, a semiconductor integrated circuit (IC), or the like. The driving circuit 120 and the lead electrodes 90 are electrically connected by the connecting wire 121 made of a conductive wire such as a bonding wire.

Further, a compliance substrate 40 including a sealing film 41 and a fixing plate 42 is bonded to the protective substrate 30. The sealing film 41 is made of a flexible material having a low rigidity. For example, a polyphenylene sulfide (PPS) film at a thickness of 6 μm may be used. The sealing film 41 seals the reservoir section 31 from one side of the ink jet recording head I. The fixing plate 42 is made of a hard material such as a metal. For example, a stainless steel (SUS) plate having a thickness of 30 μm may be used. A portion of the fixing plate 42 facing the reservoir 100 is removed so as to provide an opening 43. The reservoir 100 is sealed solely by the flexible sealing film 41 from one side of the ink jet recording head I.

In the ink jet recording head I of the first embodiment, ink is supplied from an external ink supply unit (not shown) to fill the inside of the ink jet recording head I from the reservoir 100 to the nozzle openings 21. The driving circuit 120 sends a recording signal to apply a voltage between the lower electrode film 60 and the upper electrode films 80 of the pressure-generating chambers 12. This causes the elastic film 50, the insulator film 55, the lower electrode film 60, and the piezoelectric layers 70 to be deflected, which increases the pressure in the pressure-generating chambers 12, causing ink droplets to be ejected through the nozzle openings 21.

Figure 3:
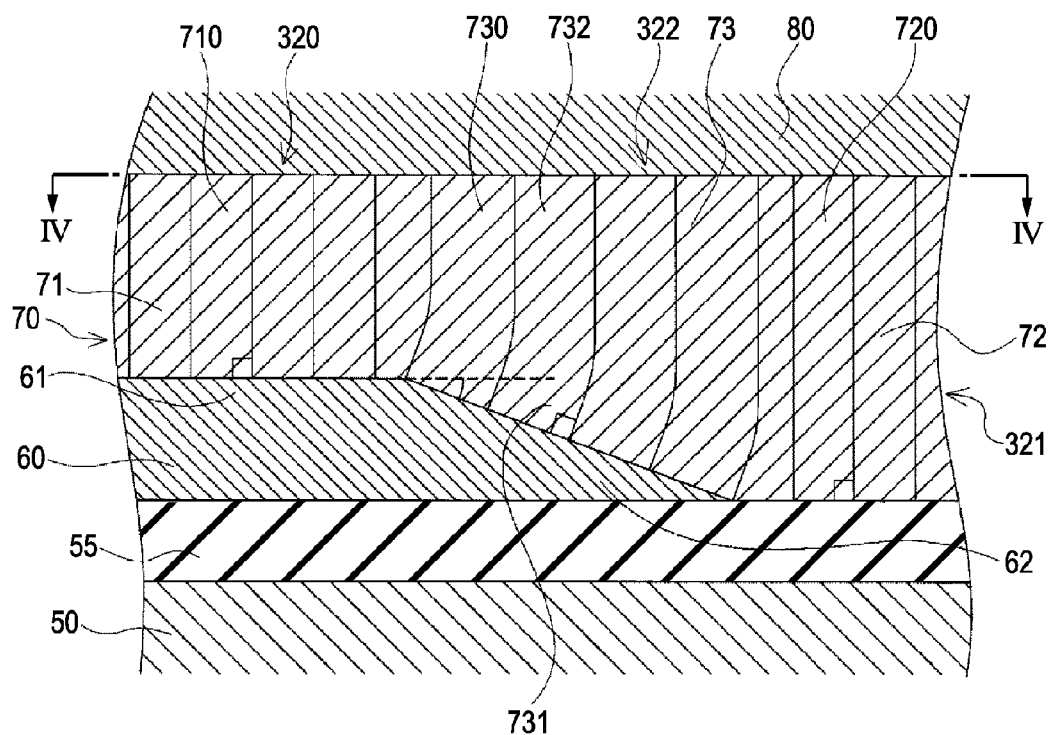
FIG. 3 is an enlarged sectional view of a piezoelectric element according to the first embodiment of the invention.

Next, the piezoelectric layer 70 constituting the above-mentioned piezoelectric element 300 will be described in detail. Referring to FIG. 3, which is an enlarged sectional view of the piezoelectric element 300 of the first embodiment of the invention, the piezoelectric layer 70 includes three layers, which are the first to third piezoelectric layers 71 to 73.

The first piezoelectric layer 71 resides on the flat portion 61 of the lower electrode film 60. The flat portion 61 has a top surface that is parallel to the surface of the insulator film 55. The first piezoelectric layer portion 71 includes a plurality of columnar crystals 710 extending orthogonally from the top surface of the lower electrode film 60. The second piezoelectric layer portion 72 resides on the insulator film 55 and includes a plurality of columnar crystals 720 extending orthogonally from the top surface of the insulator film 55. The top surface of the insulator film 55 is parallel to the top surface of the channel-forming substrate 10.

The third piezoelectric layer portion 73 resides on each of the inclined portions 62 of the lower electrode film 60. The inclined portions 62 are angled toward the top surface of the insulator film 55 at an angle that is between 5 and 50 degrees. In the first embodiment, the inclined portions 62 supporting the third piezoelectric layer portions 73 are angled at about 25 degrees.

Figure 4:
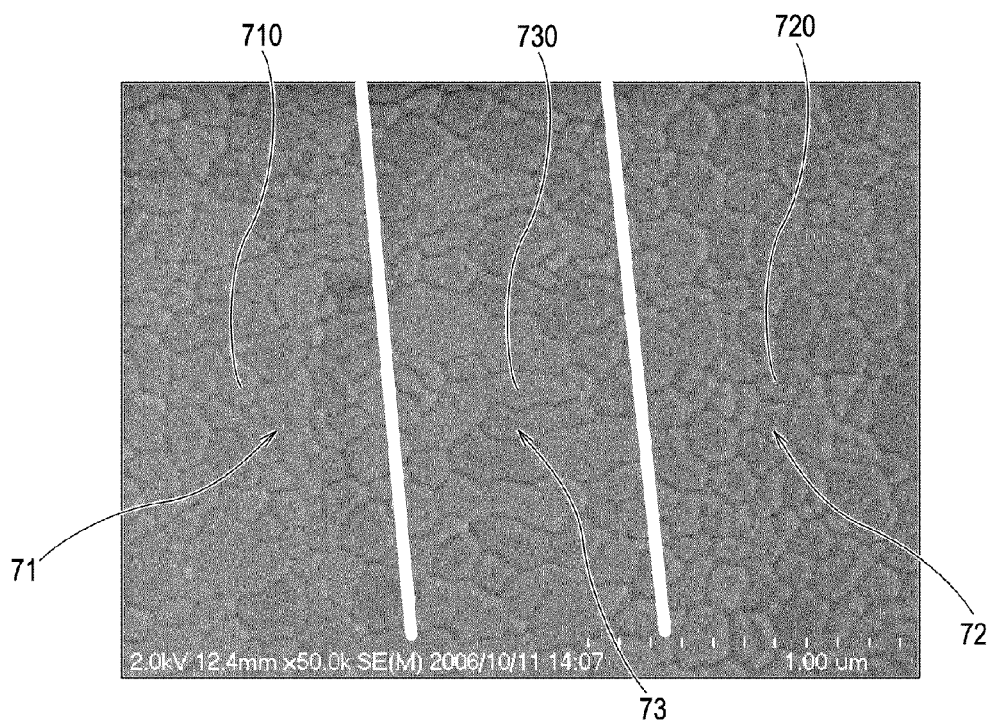
FIG. 4 schematically shows a surface of the piezoelectric element of FIG. 3 along plane IV-IV in FIG. 3.

The columnar crystals 730 constituting the third piezoelectric layer portions 73 extend orthogonally from the surfaces of the inclined portions 62, but curve toward the upper electrode film 80 so as to extend orthogonally to the upper electrode film 80. In other words, the columnar crystals 730 curve at midway between the lower electrode film 60 and the upper electrode film 80 so that portions 731 thereof near the lower electrode film 60 extend orthogonally to the surfaces of the inclined portions 62 whereas portions 732 thereof near the upper electrode film 80 extend orthogonally to the surface of the upper electrode film 80. FIG. 4 schematically shows a surface taken along plane IV-IV in FIG. 3 for observation the grains of the columnar crystals 710, 720, and 730 respectively constituting the first, second, and third piezoelectric layer portions 71, 72, and 73 at their end faces proximate to the upper electrode film 80. As shown in FIG. 4, the widths (the horizontal lengths in FIG. 4) of the grains are larger in the columnar crystals 730 than in the columnar crystals 710 and 720. The width direction of the grains at the end faces of the columnar crystals 730 proximate to the upper electrode film 80 corresponds to the inclined direction of the inclined portions 62. In other words, the longitudinal direction of the grains at the end faces of the columnar crystals 730 proximate to the upper electrode film 80 is parallel with the inclined direction of the inclined portions 62. This provides the columnar crystals 730 with a greater strength and resistance than the columnar crystals 710 and 720 against a stress applied in the inclined direction of the inclined portions 62 from the lower electrode film 60 toward the upper electrode film 80 or in the opposite direction.

The lower electrode film 60 having the above-described shape can be formed by providing a material for the lower electrode film 60 over the entire top surface of the insulator film 55 by sputtering, for example, and patterning the resultant. The piezoelectric layer 70 can be formed by any number of processes, including sol-gel processes or a metal-organic decomposition (MOD) processes, for example. In such configurations, the piezoelectric layer 70 is formed by applying and drying a sol, in which a metallo-organic compound is dissolved and dispersed in a solvent, so as to obtain a gel, which is then fired. The upper electrode film 80 can be formed in a sputtering process or the like.

In general, one of the two electrodes of the piezoelectric element 300 serves as a common electrode, while the other electrode and the piezoelectric layer 70 are formed into a pattern so as to correspond with the pressure-generating chambers 12. The resultant component consists of the patterned electrode and the patterned piezoelectric layer 70, wherein a region, referred to as the active piezoelectric region 320, is located where piezoelectric strain occurs when a voltage is applied to both electrodes. In addition, the component includes a region, referred to as an inactive region 321, wherein piezoelectric strain does not occur when a voltage is applied to both electrodes.

In the first embodiment, the active piezoelectric region 320 comprises the flat portion 61 of the lower electrode film 60, the first piezoelectric layer portion 71, and the upper electrode film 80. In comparison, the inactive piezoelectric region 321 comprises the second piezoelectric layer portion 72 provided on the insulator film 55 and the upper electrode film 80. Further, the first embodiment of the invention includes an intermediate piezoelectric region 322 comprising the inclined portion 62, the third piezoelectric layer portion 73, and the upper electrode film 80. That is, the intermediate piezoelectric region 322 is provided between the active piezoelectric region 320 and the inactive piezoelectric region 321. When a voltage is applied to the electrodes, the active piezoelectric region 320 is displaced while the inactive piezoelectric region 321 is not displaced. Because the active piezoelectric region 320 on one side of the intermediate piezoelectric region 322 is displaced while the inactive piezoelectric region 321 on the other side of the intermediate piezoelectric region 322 is not displaced, a stress is applied to the intermediate piezoelectric region 322. Specifically, when a voltage is applied to the electrodes, a stress is applied to the columnar crystals 730 of the third piezoelectric layer portion 73 in the longitudinal direction (the inclined direction of the inclined portion 62) from the lower electrode film 60 toward the upper electrode film 80.

As described above, the columnar crystals 730 have a higher strength than the columnar crystals 710 and 720 against a stress applied in the inclined direction of the inclined portion 62 from the lower electrode film 60 toward the upper electrode film 80. Therefore, an actuator device 1 including the piezoelectric element 300 of the invention has higher reliability and durability. Accordingly, the ink jet recording head I including the actuator device 1 constituted as such can also have higher reliability and durability.

Other Embodiments

The first embodiment has been described taking the ink jet recording head I as an example of liquid ejecting head. The invention, however, is generally directed to liquid ejecting heads and can be applied to liquid ejecting heads that eject liquids other than ink. Examples of such liquid ejecting heads include recording heads included in image recording apparatuses such as printers, colorant ejecting heads used in manufacturing color filters included in liquid crystal displays, electrode material ejecting heads used in forming electrodes included in organic electroluminescent (EL) displays and field emission displays (FEDs), and bioorganic substance ejecting heads used in manufacturing biochips.

In the first embodiment, the columnar crystals 730 of the third piezoelectric layer portion 73 extend orthogonally from the surfaces of the inclined portions 62, but curve toward the upper electrode film 80 so as be orthogonal to the top surface of the insulator film 55. However, the columnar crystals 730 may not necessarily have curves. The columnar crystals 730 only need to extend orthogonally from the surfaces of the inclined portions 62 and then bend toward the upper electrode film 80 so as to extend orthogonally to the top surface of the insulator film 55.

Further, the invention is not limited to actuator devices included in liquid ejecting heads, and can be applied to actuator devices included in other apparatuses.

What is claimed is:

1. An actuator device comprising:
   a substrate with a surface;
   a lower electrode formed on the surface of the substrate including a first portion which follows the surface of the substrate and a second portion which is inclined towards the surface of the substrate;
   a piezoelectric layer disposed on the lower electrode, the piezoelectric layer having a plurality of columnar crystals and an upper surface which follows the surface of the substrate; and
   an upper electrode formed on the piezoelectric layer;
   wherein the columnar crystals of the piezoelectric layer extend orthogonally from the second portion of the lower electrode and extend orthogonally to the upper surface of the piezoelectric layer, wherein the columnar crystals extending from the second portion have greater grain widths than the columnar crystals extending from the first portion in a direction from the second portion to the first portion at the upper surface of the piezoelectric layer.

2. An actuator device according to claim 1, wherein the piezoelectric layer is disposed on the substrate and the columnar crystals extending from the second portion have greater grain widths than the columnar crystals extending from the substrate.

3. The actuator device according to claim 1, wherein the columnar crystals have perovskite structures.

4. A liquid ejecting head comprising:
   a channel-forming substrate including a pressure-generating chamber which is capable of communicating with a nozzle opening which is capable of ejecting liquid; and
   the actuator device of claim 1 which serves as a liquid ejecting unit that is provided on one surface of the channel-forming substrate and which is capable of causing a change of pressure in the pressure-generating chamber.

* * * * *